(12) United States Patent
Tang

(10) Patent No.: US 12,713,814 B2
(45) Date of Patent: Aug. 18, 2026

(54) FLEXIBLE DISPLAY MODULE

(71) Applicant: WUHAN CHINA STAR OPTOELECTRONICS SEMICONDUCTOR DISPLAY TECHNOLOGY CO., LTD., Wuhan (CN)

(72) Inventor: Chihshun Tang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 364 days.

(21) Appl. No.: 18/585,045

(22) Filed: Feb. 22, 2024

(65) Prior Publication Data

US 2024/0196707 A1 Jun. 13, 2024

Related U.S. Application Data

(63) Continuation of application No. 17/289,207, filed as application No. PCT/CN2021/083052 on Mar. 25, 2021, now Pat. No. 11,957,030.

(30) Foreign Application Priority Data

Feb. 7, 2021 (CN) ......................... 202110167859.1

(51) Int. Cl.
*H10K 59/80* (2023.01)
*B32B 7/022* (2019.01)
(Continued)

(52) U.S. Cl.
CPC ........... *H10K 59/873* (2023.02); *B32B 7/022* (2019.01); *B32B 7/12* (2013.01); *H10K 59/871* (2023.02);
(Continued)

(58) Field of Classification Search
CPC .... H10K 59/873; H10K 59/80; H10K 59/871; H10K 59/12; H10K 50/844;
(Continued)

(56) References Cited

U.S. PATENT DOCUMENTS

2016/0101593 A1 4/2016 Nam et al.
2018/0182829 A1 6/2018 Shin et al.
2019/0025620 A1 1/2019 Tuan et al.

FOREIGN PATENT DOCUMENTS

CN 106847084 A 6/2017
CN 107216819 A 9/2017
(Continued)

OTHER PUBLICATIONS

Chinese Office Action issued in corresponding Chinese Patent Application No. 202110167859.1 dated Sep. 28, 2021, pp. 1-11.
(Continued)

*Primary Examiner* — Nikolay K Yushin
(74) *Attorney, Agent, or Firm* — PV IP PC; Wei Te Chung

(57) ABSTRACT

A flexible display module is provided. The flexible display module includes a bending area and a plane area adjacent to the bending area, and the flexible display module includes a flexible display panel; a protection cover plate; and a transparent adhesive layer, wherein the transparent adhesive layer bonds the flexible display panel and the protection cover plate, and storage modulus of at least a part of the transparent adhesive layer corresponding to the bending area is less than storage modulus of at least a part of the transparent adhesive layer corresponding to the plane area.

19 Claims, 2 Drawing Sheets

(51) Int. Cl.

| | |
|---|---|
| ***B32B 7/12*** | (2006.01) |
| ***H10K 102/00*** | (2023.01) |
| *B32B 5/18* | (2006.01) |
| *B32B 15/04* | (2006.01) |
| *B32B 15/20* | (2006.01) |
| *B32B 17/10* | (2006.01) |
| *B32B 27/30* | (2006.01) |
| *H10K 59/12* | (2023.01) |

(52) U.S. Cl.

CPC .............. *B32B 5/18* (2013.01); *B32B 15/046* (2013.01); *B32B 15/20* (2013.01); *B32B 17/10* (2013.01); *B32B 27/308* (2013.01); *B32B 2305/72* (2013.01); *B32B 2307/302* (2013.01); *B32B 2307/412* (2013.01); *B32B 2307/42* (2013.01); *B32B 2307/54* (2013.01); *B32B 2457/206* (2013.01); *H10K 59/12* (2023.02); *H10K 2102/311* (2023.02)

(58) Field of Classification Search

CPC .. H10K 50/865; H10K 50/86; H10K 50/8426; H10K 2102/311; B32B 7/022; B32B 7/12; B32B 7/023; B32B 5/18; B32B 15/046; B32B 15/04; B32B 15/20; B32B 15/016; B32B 15/017; B32B 17/10; B32B 17/10697; B32B 17/10935; B32B 17/10036; B32B 17/10972; B32B 27/308; B32B 27/30; B32B 27/12; B32B 27/023; B32B 2305/72; B32B 2307/302; B32B 2307/412; B32B 2307/42; B32B 2307/54; B32B 2457/206; Y02E 10/549; G09F 9/301

See application file for complete search history.

(56) References Cited

FOREIGN PATENT DOCUMENTS

| | | | |
|---|---|---|---|
| CN | 107799011 | A | 3/2018 |
| CN | 109147573 | A | 1/2019 |
| CN | 109377887 | A | 2/2019 |
| CN | 109473046 | A | 3/2019 |
| CN | 110164315 | A | 8/2019 |
| CN | 110570761 | A | 12/2019 |
| CN | 111725280 | A | 9/2020 |
| CN | 112002227 | A | 11/2020 |

OTHER PUBLICATIONS

Chinese Office Action issued in corresponding Chinese Patent Application No. 202110167859.1 dated Mar. 31, 2022, pp. 1-7.

International Search Report in International application No. PCT/CN2021/083052, mailed on Nov. 5, 2021.

Written Opinion of the International Search Authority in International application No. PCT/CN2021/083052,mailed on Nov. 5, 2021.

FLEXIBLE DISPLAY MODULE

RELATED APPLICATIONS

This application is a National Phase of PCT Patent Application No. PCT/CN2021/083052 having international filing date of Mar. 25, 2021, which claims the benefit of priority of Chinese Patent Application Nos. 202110167859.1 filed on Feb. 7, 2021. The contents of the above applications are all incorporated by reference as if fully set forth herein in their entirety.

FIELD OF INVENTION

The present application relates to the field of display technology, and especially to a flexible display module.

BACKGROUND OF INVENTION

Currently, one of significant features of a flexible organic light-emitting diode display module is bendability. In a flexible organic light-emitting diode display module including a three dimensional (3D) protection cover plate with a fixed curvature and a flexible organic light-emitting diode display panel, the flexible organic light-emitting diode display panel is bonded to the 3D protection cover plate through consolidated ultraviolet (UV) optical cement. However, during a course of laminating or reliability test of the 3D protection cover plate and the flexible organic light-emitting diode display panel, cracks occur in an inorganic layer of the flexible organic light-emitting diode display panel due to excessive bending stress, and the cracks further lead to a problem of display function failure of the flexible organic light-emitting diode display panel.

Therefore, it is necessary to provide a technical approach to solve the above-mentioned problem of display function failure of the flexible organic light-emitting diode display module due to cracks of the inorganic layer during the course of laminating or reliability test.

SUMMARY OF INVENTION

The present application is to provide a flexible display module to solve the problem of display function failure of the flexible organic light-emitting diode display module due to cracks of the inorganic layer during the course of laminating or reliability test.

A flexible display module, wherein the flexible display module includes a bending area and a plane area adjacent to the bending area, and the flexible display module includes a flexible display panel; a protection cover plate; and a transparent adhesive layer, wherein the transparent adhesive layer bonds the flexible display panel and the protection cover plate, and storage modulus of at least a part of the transparent adhesive layer corresponding to the bending area is less than storage modulus of at least a part of the transparent adhesive layer corresponding to the plane area.

The present application provides a flexible display module. Through making storage modulus of at least a part of a transparent adhesive layer corresponding to a bending area be less than storage modulus of at least a part of the transparent adhesive layer corresponding to a plane area, tangential stress of the transparent adhesive layer at a interface with a flexible display panel due to bending resilience is decreased, decreasing probability of cracks and delamination of a film layer of the flexible display panel under a large curvature, and ensuring product reliability.

DETAILED DESCRIPTION OF PREFERRED EMBODIMENTS

Figure 1:
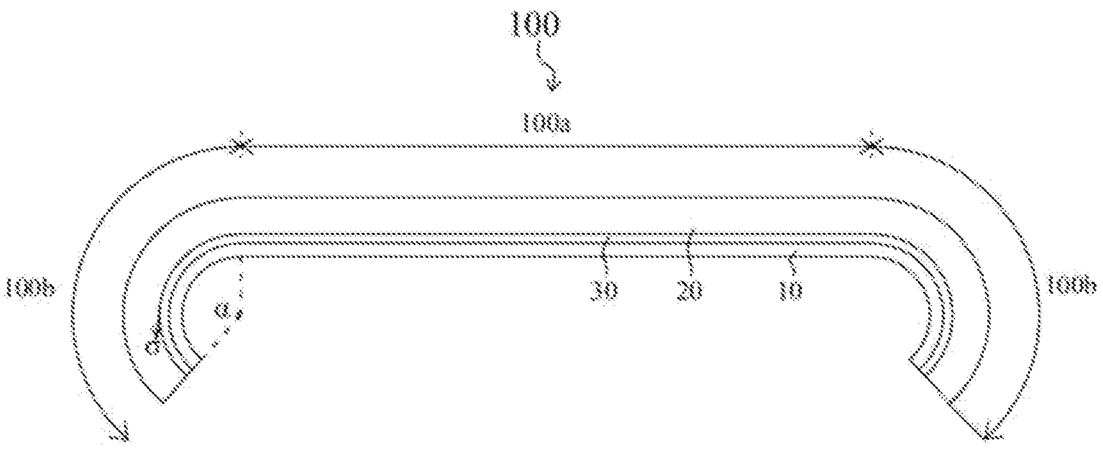
FIG. 1 is a schematic diagram of a flexible display module according to an embodiment of the present application.

For better clearness and definiteness of purpose, technical approach, and effect of the present application, the following further describes embodiments of the present application in detail with reference to accompanying drawings. It should be understood that the embodiments described here is merely for explaining the present application and not intended to limit the present application.

In conventional technology, ultraviolet (UV) optical cement is used to laminate a flexible display panel with a three dimensional (3D) glass protection cover plate. After laminating and pressure deaeration, using a UV light source emitting ultraviolet with a certain wavelength to cure the UV optical cement, internal molecular chains of the UV optical cement are polymerized, enhancing adhesion tension of the UV optical cement between the glass protection cover plate and the flexible display panel, and making a modulus of the cement increase. Generally, to ensure an interface between the UV optical cement and the 3D glass protection cover plate and that between the UV optical cement and the flexible display panel have a same adhesion tension, an equal ultraviolet irradiation energy is required for a part of the UV optical cement corresponding to a plane area and that corresponding to a bending area to achieve a uniform curing rate. However, with a property of low creep and high modulus of the UV optical cement after a surface curing, yields of laminating and reliability test of a flexible display module manufactured by a high curvature 3D glass protection cover plate are low.

Directed to the problem of the conventional technology, through making storage modulus of a part of a transparent adhesive layer bonding the protection cover plate and the flexible display panel and corresponding to a bending area less than that of a part of the transparent adhesive layer corresponding to a plane area, the present application decreases bending resilience of the part of the transparent adhesive layer corresponding to the bending area, decreases tensile stress at an interface of the flexible display panel that the transparent adhesive layer exerts to the flexible display panel under the resilience, and further mitigates cracks of the flexible display panel under excessive tensile stress. Furthermore, the part of the transparent adhesive layer corresponding to the plane area has a greater modulus, it retains original mechanical characteristic of the transparent adhesive layer at the plane area, and the greater modulus can make the flexible display module capable of bearing greater pressure at the plane area, and achieve the extent of preventing deformation imprinting.

Furthermore, even though an adhesive layer is also included in a conventional flexible display panel, such as an adhesive layer disposed between a rear cover plate and an organic light-emitting diode display panel, and an adhesive layer disposed between a polarizer and the organic light-emitting diode display panel, because a thickness of these adhesive layers is generally between about 20 micrometers to 30 micrometers, that is, the thickness of these adhesive layers is thinner, decreasing storage modulus of these adhesive layers corresponding to a bending area contributes less to decreasing stress exerted on a part of the flexible display panel corresponding to the bending area. Meanwhile, a thickness of a transparent adhesive layer between a protection cover plate and the flexible display panel is thicker, decreasing storage modulus of a part of the transparent adhesive layer between the protection cover plate and the flexible display panel corresponding to the bending area, and contributing more significantly to decreasing stress exerted on a part of the flexible display panel corresponding to the bending area.

Referring to FIG. 1, FIG. 1 is a schematic diagram of a flexible display module according to an embodiment of the present application. The flexible display module 100 includes a plane area 100*a* and a bending area 100*b* located on opposite sides of the plane area 100*a*, and the bending area 100*b* is adjacent to the plane area 100*a*. The flexible display module 100 includes a flexible display panel 10, a protection cover plate 20, and a transparent adhesive layer 30. The transparent adhesive layer 30 bonds the flexible display panel 10 and the protection cover plate 20.

Figure 2:
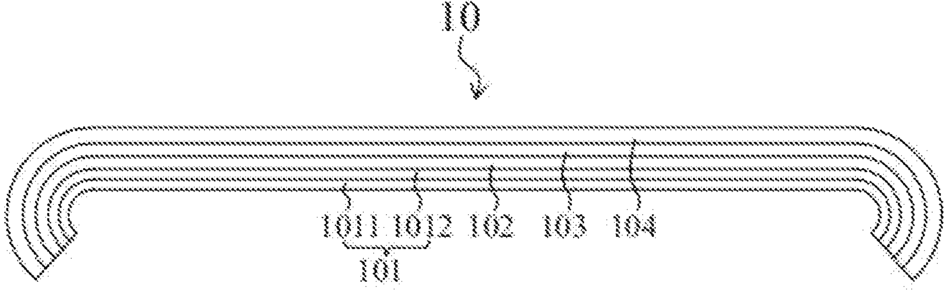
FIG. 2 is a schematic diagram of a flexible display panel shown in FIG. 1.

As shown in FIG. 2, FIG. 2 is a schematic diagram of the flexible display panel shown in FIG. 1. The flexible display panel 10 includes a heat dissipation layer 101, a rear cover plate 102, an organic light-emitting diode display panel 103, and a polarizer 104 sequentially stacked. Wherein, the polarizer 104 is disposed near the transparent adhesive layer 30, and the heat dissipation layer 101 is disposed away from the transparent adhesive layer 30.

In the present embodiment, the organic light-emitting diode display panel 103 is configured to display pictures. The organic light-emitting diode display panel 103 includes a thin film transistor array layer, an organic light-emitting diode array layer, and a thin film encapsulating layer sequentially stacked. Wherein, the thin film transistor array layer includes a plurality of thin film transistors arranged in an array. The thin film transistor array layer includes a plurality of patterned metal layers and insulation layers, and the plurality of insulation layers include an inorganic insulation layer and an organic insulation layer. The organic light-emitting diode array layer includes a plurality of organic light-emitting diodes arranged in an array, and the organic light-emitting diodes includes a cathode, an anode, and an organic light-emitting layer disposed between the cathode and the anode. The thin film encapsulating layer includes two inorganic insulation layers and an organic insulation layer located between the two inorganic insulation layers. A manufacturing material of the inorganic insulation layers is selected from at least one of silicon nitride or silica, and a manufacturing material of the organic insulation layer is selected from polyimide or acrylate. Because the organic light-emitting diode display panel includes the inorganic insulation layer, after laminating and bending of the organic light-emitting diode display panel, flexural stress is exerted to the inorganic insulation layer. When the inorganic insulation layer is under excessive flexural stress, cracks occur and lead to display function failure of the organic light-emitting diode display panel.

In the present embodiment, the polarizer 104 is a circular polarizer and configured to decrease reflection of ambient light. The rear cover plate 102 is a flexible polymer layer and configured to protect a rear side of the organic light-emitting diode display panel 103. The heat dissipation layer 101 is configured to dissipate heat and includes a foam layer 1012 and a heat conduction metal layer 1011, and the foam layer 1012 is disposed between the heat conduction metal layer 1011 and the rear cover plate 102. The heat conduction metal layer 1011 is copper foil.

In the present embodiment, the protection cover plate 20 is configured to protect the polarizer 104 and the organic light-emitting diode display panel 103. The protection cover plate 20 is a three dimensional (3D) glass cover plate and is transparent. A part of the protection cover plate 20 corresponding to the plane area 100*a* is a plane portion, and a part of the protection cover plate 20 corresponding to the bending area 100*b* is a circular arc bending portion. A radian a of the part of the protection cover plate 20 corresponding to the bending area 100*b* is greater than 90 degrees and less than 180 degrees, so that the flexible display module 100 has a large curvature. Specifically, the radian a of the part of the protection cover plate 20 corresponding to the bending area 100*b* is 100, 105, 110, 120, 130, 140, 150, or 175 degrees.

In the present embodiment, storage modulus of at least a part of the transparent adhesive layer 30 corresponding to the bending area 100*b* is less than that of at least a part of the transparent adhesive layer 30 corresponding to the plane area 100*a*, to decrease tangential stress of the transparent adhesive layer 30 at an interface with the flexible display panel 10 under bending resilience, decrease tensile stress at the bending portion of the flexible display panel 10, and decrease probability of the inorganic film layer of the flexible display panel occurring cracks and delamination under a large curvature.

It should be explained that tangential stress exerted to the transparent adhesive layer 30 shown in FIG. 1 is expressed as $\sigma=(\varepsilon1+\varepsilon2v)\,Y/2(1-v2)$, wherein, v is Poisson's ratio, Y is storage modulus of the transparent adhesive layer, ε1 is a first strain, ε2 is a second strain, a direction of the first strain is perpendicular to that of the second strain, and a direction of the tangential stress σ is the same as that of the first strain. Under a situation of a fixed thickness and bend radius of the flexible display module, ε1 and ε2 are constant values. It can be seen that the tangential stress is proportional to the storage modulus of the transparent adhesive layer 30, if the storage modulus of the transparent adhesive layer 30 is greater, then the tangential stress σ is greater.

In the present embodiment, a ratio of a difference value of storage modulus of a part the transparent adhesive layer 30 corresponding to the plane area 100*a* and that of a part of the transparent adhesive layer 30 corresponding to the bending area 100*b*, to the storage modulus of the part of the transparent adhesive layer 30 corresponding to the plane area 100*a* is greater than or equal to 30% and less than 100%, so that the storage modulus of the part of the transparent adhesive layer 30 corresponding to the plane area 100*a* is greater to have satisfactory mechanical performance, and the storage modulus of the transparent adhesive layer 30 corresponding to the bending area 100*b* is lesser to decrease tangential stress exerted to the part of the flexible display panel 10 corresponding to the bending area. For example, the ratio can be 35%, 40%, 45%, 50%, 60%, 80%, 85%, or 90%.

Specifically, the storage modulus of the part of the transparent adhesive layer 30 corresponding to the plane area 100*a* is greater than or equal to 115 kPa, so that the part of the transparent adhesive layer 30 corresponding to the plane area 100*a* has original mechanical characteristic, making the flexible display module capable of bearing greater pressure and achieve the extent of preventing deformation imprinting at the plane area 100*a*. The storage modulus of the part of the transparent adhesive layer 30 corresponding to the bending area 100*b* is greater than or equal to 20 kPa and less than or equal to 80 kPa, so that while the part of the transparent adhesive layer 30 corresponding to the bending area 100*b* has satisfactory deformation capacity (including creep performance), a certain bonding effect of the transparent adhesive layer 30 is ensured between the protection cover plate 20 and the flexible display panel 10, fulfilling a storage modulus requirement of the transparent adhesive layer 30 under a low bend radius of the flexible display module. Specifically, the storage modulus of the part of the transparent adhesive layer 30 corresponding to the plane area 100*a* can be 118 kPa, 120 kPa, 130 kPa, 150 kPa, 200 kPa, or equal to or greater than 200 kPa. The storage modulus of the part of the transparent adhesive layer 30 corresponding to the bending area 100*b* can be 20 kPa, 25 kPa, 30 kPa, 40 kPa, 55 kPa, 60 kPa, 65 kPa, or 70 kPa.

In the present embodiment, the transparent adhesive layer 30 is UV curing glue, and a manufacturing material of the UV curing glue is acrylate and its derivatives. A curing rate of the part of the transparent adhesive layer 30 corresponding to the bending area 100*b* is less than that of the part of the transparent adhesive layer 30 corresponding to the plane area 100*a*, so that the storage modulus of the part of the transparent adhesive layer 30 corresponding to the bending area 100*b* is less than that of the part of the transparent adhesive layer 30 corresponding to the plane area 100*a*. Decreasing a curing degree of an adhesive layer of the bending area 100*b*, so that this area of glue remains softer, that is, modulus of this area of glue is decreased and the creep is increased, thereby decreasing tensile stress exerted to the bending area 100*b* of the flexible display panel, further decreasing probability of film layer cracks and delamination of the flexible display panel under a large curvature, and ensuring product reliability. Meanwhile, a higher curing rate of the transparent adhesive layer 30 is retained at the plane area 100*a*, so that the transparent adhesive layer 30 at the plane area retains original mechanical characteristic of the transparent adhesive layer 30, and a greater glue modulus makes the flexible display module capable of bearing greater pressure and achieve the extent of preventing deformation imprinting at the plane area, and prevents a low curing rate of the part of the transparent adhesive layer 30 corresponding to the plane area 100*a*, which leads to bubble easily occurring at the part of the transparent adhesive layer 30 corresponding to the plane area 100*a*, thereby affecting the appearance.

It should be explained that difference of the curing rate of the part of the transparent adhesive layer 30 corresponding to the bending area 100*b* and the curing rate of the part of the transparent adhesive layer 30 corresponding to the plane area 100*a* can be realized in many ways. For example, adjusting a number of light beads emitting UV, and/or adjusting a distance between the light beads emitting UV, and/or adjusting power of the light beads emitting UV. Or, separately curing the part of the transparent adhesive layer 30 of the flexible display module 100 corresponding to the bending area 100*b* and the part of the flexible display module 100 corresponding to the plane area 100*a*.

In the present embodiment, the curing rate of the part of the transparent adhesive layer 30 corresponding to the bending area 100*b* is greater than or equal to 0% and less than 80%, so that while the part of the transparent adhesive layer 30 corresponding to the bending area 100*b* has a lesser storage modulus, almost no bubble occurring at the part of the transparent adhesive layer 30 corresponding to the bending area 100*b* is ensured, ensuring a sufficient bonding of the part of the transparent adhesive layer 30 corresponding to the bending area 100*b*. The curing rate of the part of the transparent adhesive layer 30 corresponding to the plane area 100*a* is greater than or equal to 80%, so that the transparent adhesive layer 30 has a greater storage modulus, decreasing bubbles occurring at the part of the transparent adhesive layer 30 corresponding to the plane area 100*a* after curing. The curing rate of the transparent adhesive layer 30 is greater than or equal to 80%, the transparent adhesive layer 30 is basically entirely cured. The curing rate of the part of the transparent adhesive layer 30 corresponding to the bending area 100*b* can be 0%, 5%, 10%, 15%, 20%, 25%, 30%, or 40%. The curing rate of the part of the transparent adhesive layer 30 corresponding to the plane area 100*a* can be 80%, 85%, 88%, or 90%.

In the present embodiment, the curing rate of the part of the transparent adhesive layer 30 corresponding to the bending area 100*b* is 35%-45%, and the curing rate of the part of the transparent adhesive layer 30 corresponding to the plane area 100*a* is 75%-85%, to decrease probability of cracks of the flexible display panel 10 occurring at the bending area 100*b*, while increasing mechanical performance of the flexible display module at the plane area 100*a*, making probability of bubbles occurring at the part of the transparent adhesive layer 30 corresponding to the plane area 100*a* and to the bending area 100*b* be zero after reliability test, and increasing reliability of the flexible display module. Specifically, the curing rate of the part of the transparent adhesive layer 30 corresponding to the bending area 100*b* is 40%, and the curing rate of the part of the transparent adhesive layer 30 corresponding to the plane area 100*a* is 80%.

In the present embodiment, a thickness of the transparent adhesive layer 30 is 100-150 micrometers. For example, the thickness of the transparent adhesive layer 30 is 110, 120, 130, or 140 micrometers. The thinner the thickness of the transparent adhesive layer 30 is, the more the strain exerted to the part of the flexible display panel 10 corresponding to the bending area 100*b* is decreased.

In the present embodiment, a radius of the flexible display module 100 corresponding to the bending area 100*b* is 2-5 millimeters, such as 3 or 4 millimeters. The greater the bend radius is, the more the strain exerted to the part of the flexible display panel 10 corresponding to the bending area 100*b* is decreased.

Referring to table 1, table 1 is a test result of laminating crack ratios and a reliability test of the flexible display module after laminating under different UV curing rates of an undercut glass protection cover plate of 130 degrees laminating with a flexible display panel through 3M series CF3006 type UV glue. Wherein, a temperature condition of the reliability test is 85 degrees, humidity is 85, and test time is 240 hours.

TABLE 1

| UV glue curing rate | laminating crack ratio | reliability test | |
|---|---|---|---|
| | | plane area | bending area |
| 40% | 20% | cracks 0%, bubbles 100% | cracks 20%, bubbles 0% |
| 80% | 28% | cracks 0%, bubbles 0% | cracks 40%, bubbles 0% |

As shown in table 1, during the course of laminating, a laminating crack ratio when a UV glue curing rate is 40% is lower by 8% than a laminating crack ratio when a UV glue curing rate is 80%, and therefore a lesser curing rate of the UV curing glue facilitates decreasing probability of cracks occurring during the course of laminating. Furthermore, regarding the reliability test, when a curing rate of the UV glue is 40%, a probability of bubbles occurring at the plane area of the flexible display module is 100%, and no bubble occurs at the part of the flexible display module corresponding to the bending area, and therefore a lower UV glue curing rate leads to more bubbles at the flexible display film layer corresponding to the plane area, without leading to bubbles occurring at the bending area. When a UV glue curing rate is 80%, a crack ratio of the flexible display panel increases by 20% in comparison with 40% curing rate of the UV glue, and therefore a higher UV glue curing rate at the bending area is adverse to decreasing probability of cracks occurring at the flexible display panel.

Figure 3:
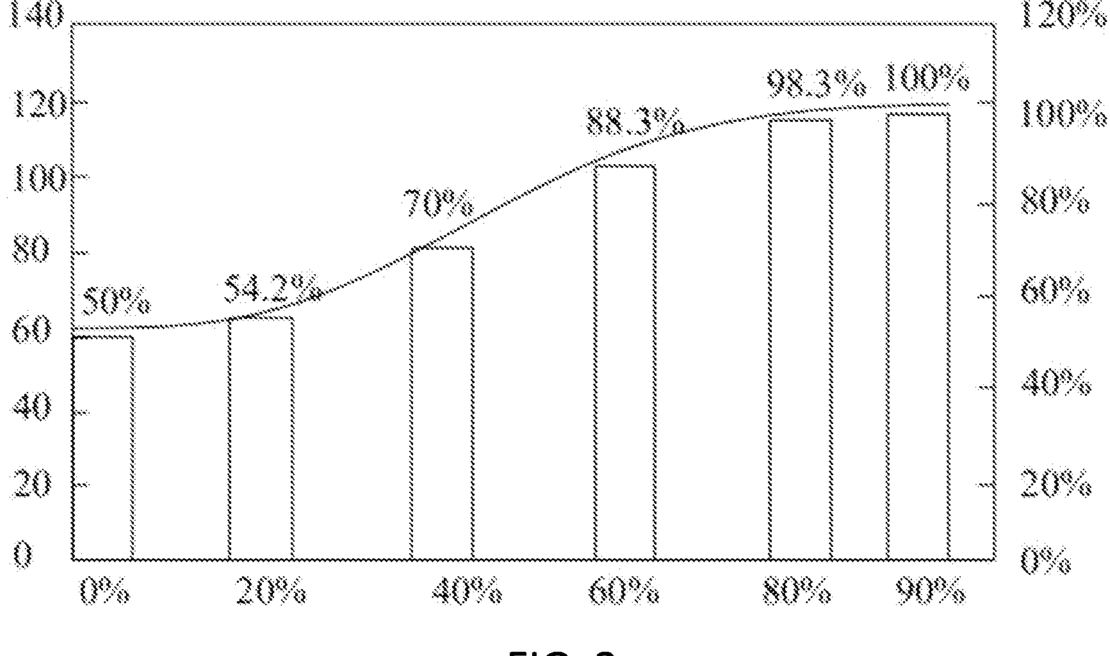
FIG. 3 is storage moduli of a 3M series CF3006 type ultraviolet (UV) glue under different curing rates.

Referring to FIG. 3, FIG. 3 is storage moduli of a 3M series CF3006 type UV glue under different curing rates. The horizontal axis of FIG. 3 is curing rates of the UV glue, the left side vertical axis of FIG. 3 is storage moduli corresponding to the curing rates, the right side vertical axis of FIG. 3 is ratios of the storage moduli corresponding to the curing rates to storage modulus when the curing rate is 90%. As can be seen from FIG. 3, as the UV glue curing rate increases from 10% to 90%, the storage modulus of the glue layer after curing increases.

Furthermore, as can be seen from FIG. 3 together with table 1, when the curing rate is 40%, storage modulus of the glue layer after curing is 80 kPa. When the curing rate is 80%, storage modulus of the glue layer after curing is about 115 Pa. Therefore, storage modulus of the UV glue corresponding to the bending area is 80 kPa, and storage modulus of the UV glue corresponding to the plane area is 115 Pa, ensuring no bubble occurring at the plane area of the flexible display module and a high storage modulus of the UV glue layer, while a significant decreased probability of cracks occurring at the bending area of the flexible display panel module is also achieved.

It can be understood that, for a person of ordinary skill in the art, equivalent alteration or changes can be made according to technical approaches and invention thought of the present application, and all the changes or alteration is within the scope protected by appended claims of the present application.

What is claimed is:

1. A display module, comprising a bending area and a plane area adjacent to the bending area, the display module further comprising:
- a display panel;
- one or more first functional layers disposed on at least one side of the display panel; and
- one or more first adhesive layers, wherein each of the one or more first adhesive layers is disposed adjacent to a corresponding one of the one or more first functional layers and between the corresponding one of the one or more first functional layers and the display panel, and a storage modulus of at least a part of at least one of the one or more first adhesive layers corresponding to the bending area is less than a storage modulus of the at least a part of the at least one of the one or more first adhesive layers corresponding to the plane area.

2. The display module according to claim 1, wherein the one or more first adhesive layers comprise an ultraviolet curing adhesive.

3. The display module according to claim 1, wherein a ratio of a difference value between a storage modulus of a part of the at least one of the one or more first adhesive layers corresponding to the plane area and a storage modulus of a part of the at least one of the one or more first adhesive layers corresponding to the bending area, to the storage modulus of the part of the at least one of the one or more first adhesive layers corresponding to the plane area is greater than or equal to 30% and less than 100%.

4. The display module according to claim 1, wherein a storage modulus of a part of the at least one of the one or more first adhesive layers corresponding to the plane area is greater than or equal to 115 kPa, and a storage modulus of a part of the at least one of the one or more first adhesive layers corresponding to the bending area is greater than or equal to 20 kPa and less than or equal to 80 kPa.

5. The display module according to claim 1, wherein at least two bending area are disposed on opposite sides of the plane area.

6. The display module according to claim 1, wherein a bending radius of the display module corresponding to the bending area is greater than or equal to 2 millimeters and less than or equal to 5 millimeters.

7. The display module according to claim 1, wherein a thickness of the at least one of the one or more first adhesive layers is greater than or equal to 100 microns.

8. The display module according to claim 7, wherein the thickness of the at least one of the one or more first adhesive layers is less than or equal to 150 microns.

9. The display module according to claim 1, wherein the display panel comprises a thin film transistor array layer, an organic light-emitting diode array layer, and a thin film encapsulating layer sequentially stacked.

10. The display module according to claim 9, wherein the thin film encapsulating layer comprises two inorganic insulation layers and an organic insulation layer located between the two inorganic insulation layers.

11. The display module according to claim 1, further comprising:
- one or more second functional layers disposed on at least one side of the one or more first functional layer; and
- one or more second adhesive layers, wherein each of the one or more second adhesive layers is disposed adjacent to a corresponding one of the one or more second functional layers and between the corresponding one of the one or more second functional layers and the display panel, and a thickness of each of the one or more second adhesive layers is less than a thickness of each of the one or more first adhesive layers.

12. The display module according to claim 11, wherein the thickness of each of the one or more second adhesive layers is greater than or equal to 30 microns.

13. The display module according to claim 11, wherein the one or more second functional layers comprise a polarizer disposed on a light exiting side of the display panel, and a corresponding one of the one or more second adhesive layers is disposed adjacent to the polarizer layer and between the polarizer and the display panel; and/or,
- wherein the one or more second functional layers comprise a rear cover plate disposed on a backside of the light exiting side of the display panel, and a corresponding one of the one or more second adhesive layers is disposed adjacent to the rear cover plate and between the rear cover plate and the display panel.

14. The display module according to claim 1, wherein the one or more first functional layers comprise a protection cover plate disposed on a light exiting side of the display panel, and a corresponding one of the one or more first adhesive layers is disposed adjacent to the protection cover plate and between the protection cover plate and the display panel.

15. The display module according to claim 14, wherein a part of the protection cover plate corresponding to the plane area is a plane portion, a part of the protection cover plate corresponding to the bending area is a circular arc bending portion, and the circular arc bending portion is connected to the plane portion; a radian of the circular arc bending portion is greater than 90 degrees and less than 180 degrees.

16. The display module according to claim 14, wherein the protection cover plate comprises a glass cover plate.

17. The display module according to claim 1, wherein a curing rate of a part of the at least one of the one or more first adhesive layers corresponding to the bending area, is less than a curing rate of a part of the at least one of the one or more first adhesive layers corresponding to the plane area.

18. The display module according to claim 17, wherein the curing rate of the part of the at least one of the one or more first adhesive layers corresponding to the bending area is greater than or equal to 0% and less than 80%, and the curing rate of the part of the at least one of the one or more first adhesive layers corresponding to the plane area is greater than or equal to 80%.

19. The display module according to claim 17, wherein the curing rate of the part of the at least one of the one or more first adhesive layers corresponding to the bending area is greater than or equal to 35% and less than or equal to 45%.

* * * * *